US006238956B1

(12) United States Patent
Park

(10) Patent No.: US 6,238,956 B1
(45) Date of Patent: May 29, 2001

(54) METHOD FOR MANUFACTURING THIN FILM TRANSISTOR BY USING A SELF-ALIGN TECHNOLOGY

(75) Inventor: Sung Kye Park, Chungcheongbuk-do (KR)

(73) Assignee: Hyundai Electronics Industries Co., Ltd., Kyongki-do (KR)

( * ) Notice: Subject to any disclaimer, the term of this patent is extended or adjusted under 35 U.S.C. 154(b) by 0 days.

(21) Appl. No.: 09/343,558

(22) Filed: Jun. 30, 1999

Related U.S. Application Data

(62) Division of application No. 09/073,869, filed on May 7, 1998, now Pat. No. 5,952,677.

(30) Foreign Application Priority Data

Dec. 27, 1997 (KR) .................................................. 97/75400

(51) Int. Cl.⁷ ............................. H01L 21/00; H01L 21/84
(52) U.S. Cl. .......................... 438/149; 438/151; 438/479
(58) Field of Search ................................ 438/149, 151, 438/157, 164, 479, 517; 257/66, 347, 352, 353

(56) References Cited

U.S. PATENT DOCUMENTS

| 5,179,033 | 1/1993 | Adan | 438/152 |
|---|---|---|---|
| 5,198,379 | * 3/1993 | Adan | 438/157 |
| 5,286,663 | * 2/1994 | Manning | 438/158 |
| 5,438,540 | 8/1995 | Kim | 257/66 |
| 5,543,635 | * 8/1996 | Nguyen et al. | 257/66 |
| 5,648,662 | 7/1997 | Zhang et al. | 257/59 |
| 5,723,878 | 3/1998 | Yunai | 257/59 |
| 5,818,070 | 10/1998 | Yamasaki et al. | 257/72 |

OTHER PUBLICATIONS

Ikeda et al. (1990) Int'l Electron Devices meeting, Dec. 9–12, 1990, A Polysilicon Transistor Technology for Large Capacity SRAMs, pp. 18. 1.1–18. 1.4.

* cited by examiner

Primary Examiner—Olik Chaudhuri
Assistant Examiner—Hoai Pham

(57) ABSTRACT

A thin film transistor (TFT) and a method for manufacturing the same suitable for improving device characteristics by using a self-align technology are disclosed, the TFT including a substrate; a gate electrode having first and second sides on the substrate; a first conductive layer pattern formed on the substrate, wherein between the first conductive layer pattern and the first side of the gate electrode is a sidewall spacer; the sidewall spacer; a second conductive layer pattern formed on the substrate to be connected to the first conductive layer pattern; a gate insulating layer formed on the gate electrode; an active layer formed on the gate insulating layer, the sidewall spacer, the first conductive layer pattern, and the substrate; a source region formed in the active layer at the second side of the gate electrode; and a drain region formed on the active layer on the first conductive layer pattern.

35 Claims, 16 Drawing Sheets

METHOD FOR MANUFACTURING THIN FILM TRANSISTOR BY USING A SELF-ALIGN TECHNOLOGY

This application is a divisional of application Ser. No. 09/073,869, filed on May 7, 1998, U.S. Pat. No. 5,952,677 the entire contents of which are hereby incorporated by reference.

BACKGROUND OF THE INVENTION

1. Field of the Invention

The present invention relates to a semiconductor device and, more particularly, to a thin film transistor (TFT) and a method for manufacturing the same suitable for improving device characteristics by using a self-align technology.

2. Discussion of the Related Art

Instead of a CMOS load transistor or a load resistor, a TFT is used in an SRAM of over a 16M class or a 4M class. It is used as a switching device for switching picture data signals in each pixel region in an LCD.

Since a PMOS TFT is used as a load transistor in an SRAM cell, off-current of the load transistor is reduced and on-current is increased. Thus, power consumption of an SRAM cell is reduced and memory characteristic is enhanced, thereby proving an SRAM cell having a high quality. An offset region of a TFT is an important factor to stabilize an SRAM cell. It is significantly important how precisely offset regions are formed during its process.

A background art TFT and a method for manufacturing the same will be described with reference to the accompanying drawings.

FIG. 1 is a cross-sectional view showing a structure of a TFT, which includes an insulating layer 21, first and second gate electrode 22a and 22b formed on the insulating layer 21 to be spaced apart from each other, a source electrode S overlapping an edge portion of the first gate electrode 22a, a drain electrode D connected to the second gate electrode 22b through a contact hole and spaced apart from the first gate electrode 22a, and a metal layer 27 connected to the source electrode S and the second gate electrode 22b. In this case, a polysilicon layer used as a channel region and an offset region is between the source electrode S and the drain electrode D. The second gate electrode 22b is used as a drain.

FIGS. 2A to 2F are cross-sectional views showing process steps of a background art method for fabricating the above-described TFT.

Referring to FIG. 2A, a polysilicon layer is formed on an insulating layer 21 and selectively removed to form first and second gate electrodes 22a and 22b.

Referring to FIG. 2B, a gate insulating film 23 is deposited on the insulating layer 21 including the first and second gate electrodes 22a and 22b.

Referring to FIG. 2C, a predetermined area of the gate insulating film 23 on the second gate electrode 22b is removed so that the surface of the second gate electrode 22b is exposed.

Referring to FIG. 2D, a polysilicon layer 24 for source and drain electrodes is formed and then an ion-injecting process for adjusting threshold voltage is performed.

Referring to FIG. 2E, a photoresist film is coated on the entire surface and patterned to form a mask pattern 25. An ion-injecting process is performed by using the mask pattern 25 to form source and drain regions S and D.

Referring to FIG. 2F, an interlayer insulating film 26 is deposited, and the interlayer insulating layer 26 and the gate insulating film 23 are patterned to expose predetermined areas of the second gate electrode 22b and the source electrode S. Metal layers 27 are formed. At this time, the source region S partially overlaps the first gate electrode 22a. The drain region D is formed spaced apart from the first gate electrode 22a. A channel region I and an offset region II are all formed between the source and drain regions S and D.

The background art TFT and the method for manufacturing the same have the following problems.

A photo mask process is required for forming an offset region and misalignment of photoresist changes channel region and offset region. This change of channel region and offset region deteriorates device reliability and the stability of cells an SRAM.

SUMMARY OF THE INVENTION

Therefore, the present invention is directed to a TFT and a method for manufacturing the same that substantially obviates one or more problems due to limitations and disadvantages of the related art.

An object of the invention is to provide a TFT and a method for manufacturing the same in which a self-align method is used to form offset region and channel region so as to minimize the change of I–V characteristic, and a gate of an inverse-T type structure is adopted to increase on-current.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the TFT includes a substrate; a gate electrode having first and second sides on the substrate; a first conductive layer pattern formed on the substrate, wherein between the first conductive layer pattern and the first side of the gate electrode is a sidewall spacer; a second conductive layer pattern formed on the substrate to be connected to the first conductive layer pattern; a gate insulating layer formed on the gate electrode; an active layer formed on the gate insulating layer, the sidewall spacer, the first conductive layer pattern, and the substrate; a source region formed in the active layer at the second side of the gate electrode; and a drain region formed on the active layer on the first conductive layer pattern.

In another aspect of the present invention, a method for manufacturing a TFT includes the steps of successively forming a first conductive layer, a first insulating layer, and a second conductive layer on a substrate; patterning the first conductive layer, the first insulating layer, and the second conductive layer to form a gate electrode having first and second sides and a first conductive layer pattern; forming a sidewall spacer on the first side of the first gate facing the first conductive layer pattern; forming a second conductive layer pattern between the sidewall spacer and the first conductive layer pattern; forming an active layer on the first insulating layer on the gate electrode, the sidewall spacer, the second conductive layer, and the substrate; and source and drain regions formed in the active layer at the second side and in the active layer on the second conductive layer, respectively.

It is to be understood that both the foregoing general description and the following detailed description are exemplary and explanatory and are intended to provide further explanation of the invention as claimed

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1:
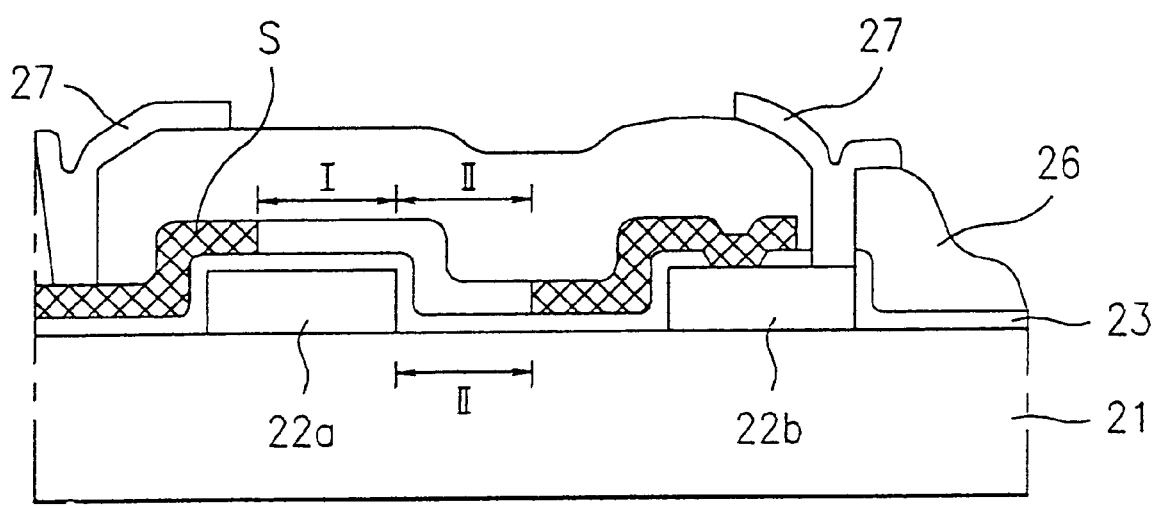
FIG. 1 is a cross-sectional view showing a structure of a background art TFT.
Figure 2A:
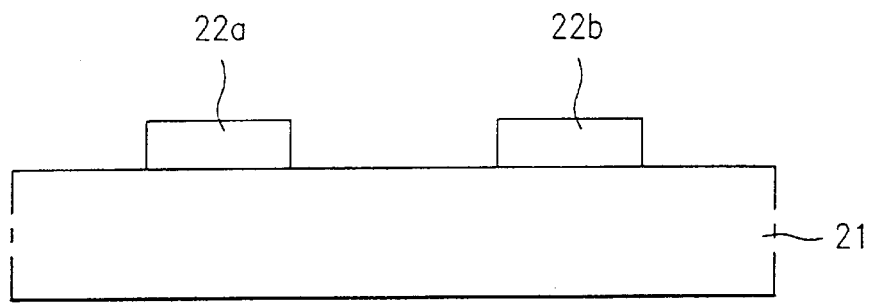
FIGS. 2A to 2F are cross-sectional views showing process steps of a background art method for manufacturing a TFT.
Figure 2B:
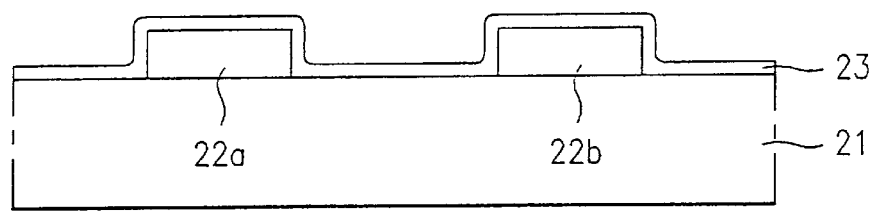
Figure 2C:
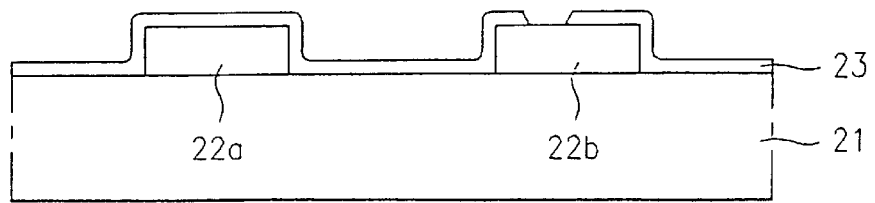
Figure 2D:
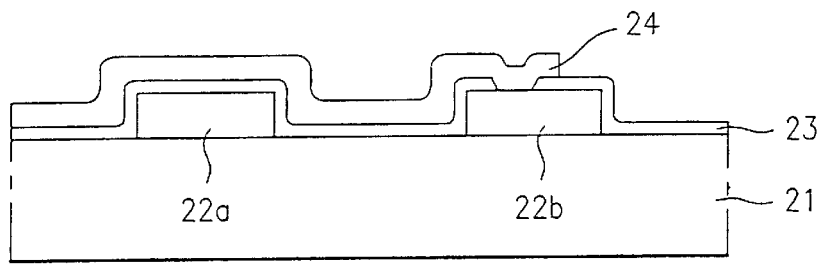
Figure 2E:
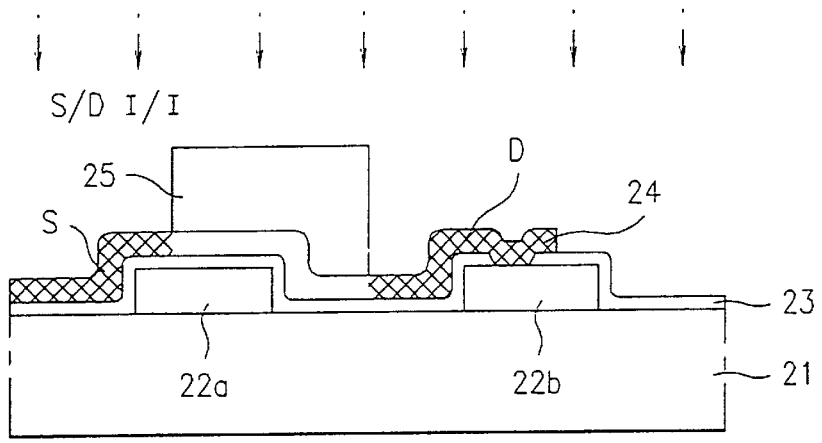
Figure 2F:
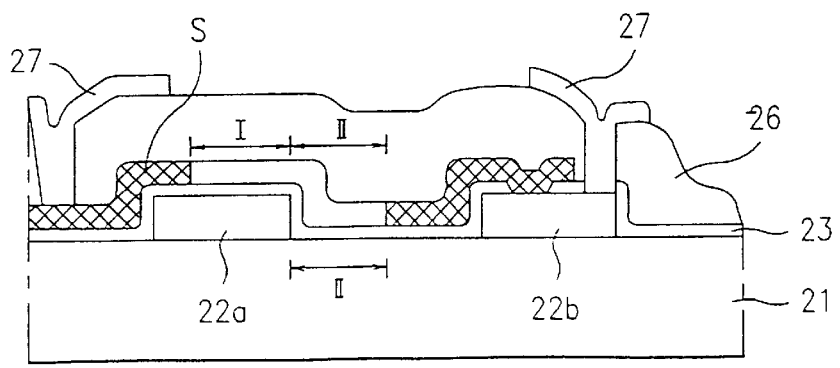
Figure 3:
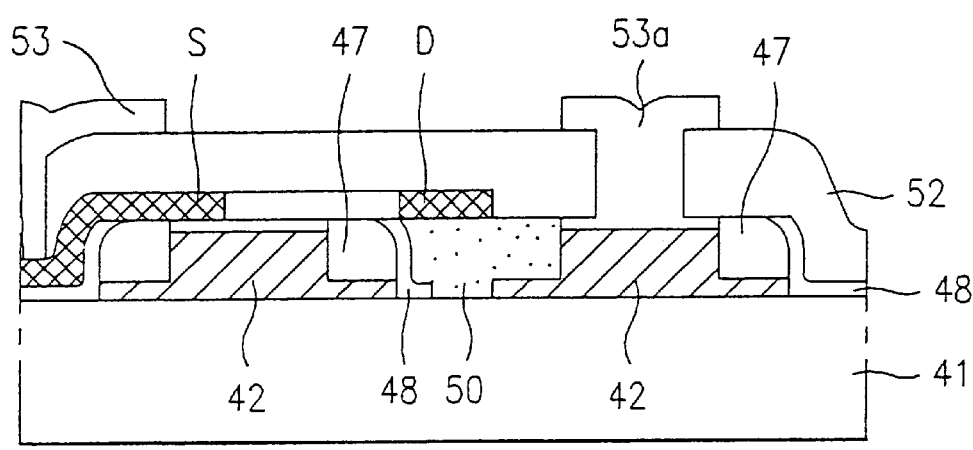
FIG. 3 is a cross-sectional view showing a structure of a TFT according to a first embodiment of the present invention.

FIG. 3 is a cross-sectional view showing a structure of a TFT, which includes a substrate, a gate electrode formed on the substrate to have first and second sides, a conductive layer pattern formed on the substrate, a gate insulating film formed on the gate electrode and the substrate, an active layer formed on the substrate, the gate insulating layer, and the conductive layer pattern, a source region formed in the active region at the second side of the gate electrode, and a drain region formed in the active region on the conductive layer pattern.

At this time, a polysilicon layer for a channel region and an offset region is intervened between the source and drain regions S and D. The drain region D has conductivity by diffusion of impurity ions from the conductive layer 50.

The width of the sidewall spacer 47 determines the width of the offset region. The wider the sidewall spacer 47, the wider the offset region.

A method for manufacturing the TFT will be described with reference to the accompanying drawings. FIGS. 4A to 4K are cross-sectional views showing process steps of the method for manufacturing a TFT according to the first embodiment of the present invention.

Figure 4A:
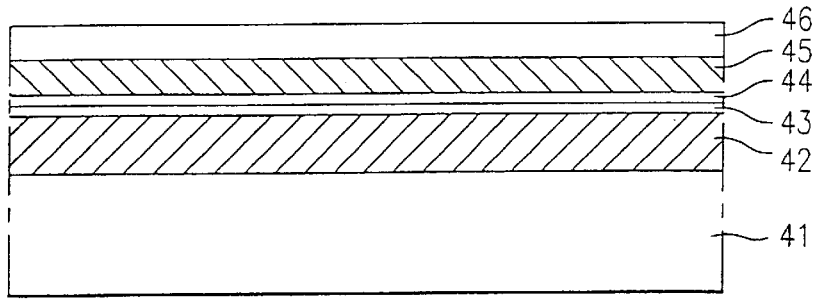
FIGS. 4A to 4K are cross-sectional views showing process steps of a method for manufacturing a TFT according to the first embodiment of the present invention.

Referring to FIG. 4A, a first polysilicon layer 42 is formed on a substrate 41. A first insulating layer 43 and a second insulating layer 44 are successively formed on the first polysilicon layer 42. The first insulating layer 43 is a gate insulating film and made of silicon oxide. The second insulating layer 44 is made of silicon nitride having a high etch ratio with silicon oxide.

Subsequently, a second polysilicon layer 45 having a high etch ratio with the second insulating layer 44 is formed on the second insulating layer 44. A photoresist film 46 is coated on the entire surface of the second polysilicon layer 45. The substrate is made of an insulator. Alternately, used is a substrate where an insulating layer is formed on a semiconductor material. A silicon oxide film having a high etch ratio with the second insulating layer 44 can be formed on the second insulating layer 44.

Figure 4B:
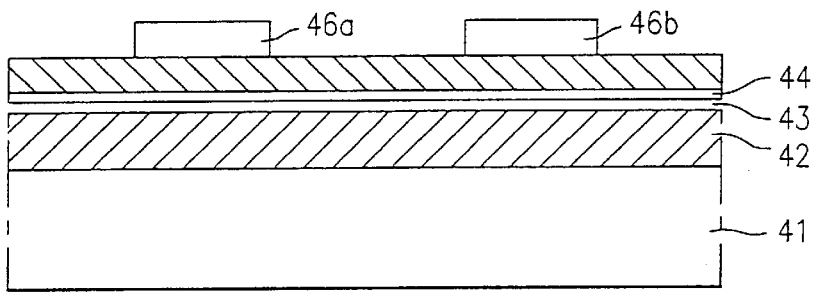

Referring to FIG. 4B, the photoresist film 46 is patterned with an exposure and development process to form first photoresist patterns 46a and 46b.

Figure 4C:
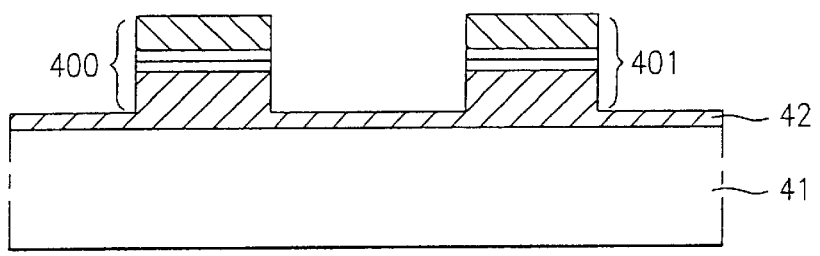

Referring to FIG. 4C, the first polysilicon layer 42, the first insulating layer 43, the second insualting layer 44, and the second polysilicon layer 45 are etched with the first photoresist patterns 46a and 46b serving as masks, thereby forming first and second patterns 400 and 401. At this time, the entire first polysilicon layer 42 is not etched, but is etched to have a predetermined thickness. The first photoresist patterns 46a and 46b are removed. Thus first and second patterns 400 and 401 are connected to each other by the remaining first polysilicon layer 42.

Figure 4D:
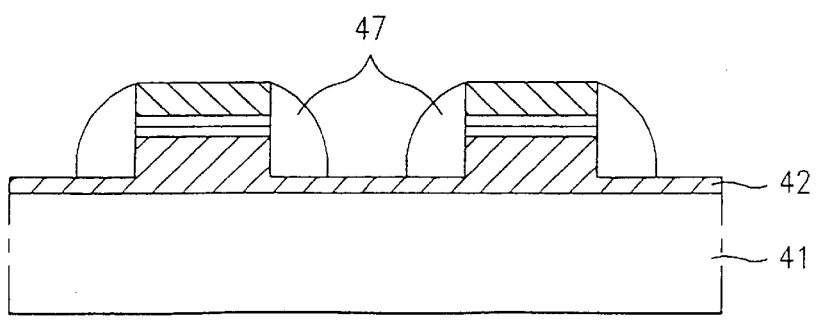

Referring to FIG. 4D, a third insulating layer, made of silicon oxide, is formed on the first polysilicon layer 42 including the first and second patterns 400 and 401 and etched-back to form sidewall spacers 47 on both sides of the first and second patterns 400 and 401.

The width of the sidewall spacer 47 depends on the thickness of the third insulating layer. That is, the thickness of the third insulating layer should be adjusted to provide a desired width of the sidewall spacers 47.

Figure 4E:
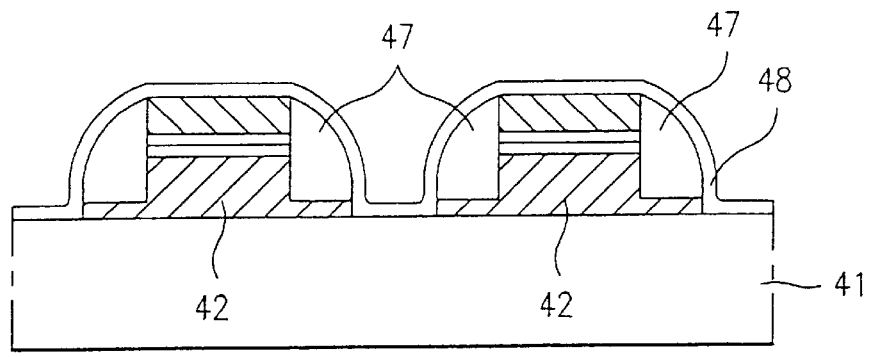

Referring to FIG. 4E, the first polysilicon layer 42 between the first and second patterns 400 and 401 is removed with the sidewall spacers 47 serving as masks, so that the surface of the substrate 41 is exposed. At this time, since there is no etch-preventing mask for the second polysilicon layer 45, the second polysilicon layer 45 is also etched by the above etching process. However, the first polysilicon layer 42 is very thin so that the second polysilicon layer 45 is etched to a very thin thickness.

Thereafter, a fourth insulating layer 48, which is a silicon oxide film, is formed on the substrate 41 including the first and second patterns 400 and 401 and the sidewall spacers 47.

Figure 4F:
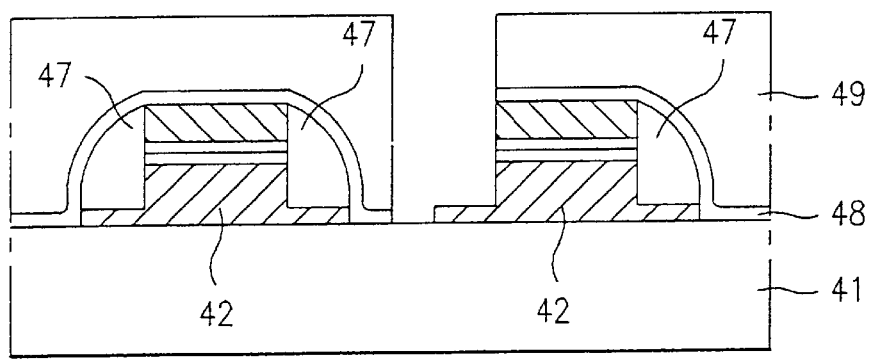

Referring to FIG. 4F, a second photoresist film 49 is coated on the fourth insulating layer 48 and patterned to expose the fourth insulating layer 48 on the sidewall spacer 47 of the second pattern 401 between the first and second patterns 400 and 401 and on an adjoining portion of substrate 41. With patterned second photoresist film 49 serving as a mask, the fourth insulating layer and the sidewall spacer 47 of the second pattern 401 are removed.

Figure 4G:
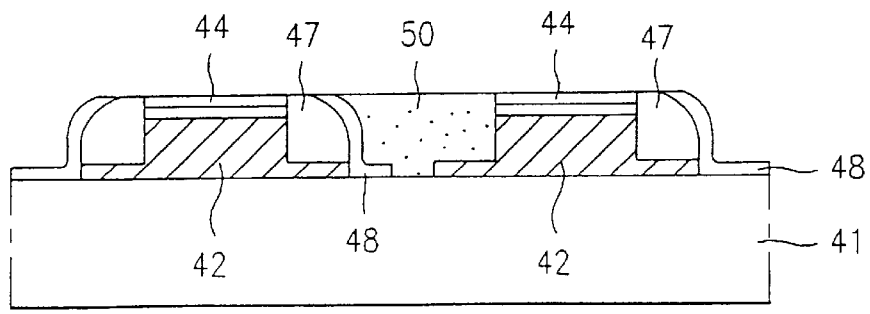

Referring to FIG. 4G, the second photoresist film 49 is removed. A conductive layer 50 is formed on the substrate-41 and etched-back to remain on the substrate 41 and the fourth insulating layer 48 between the first and second patterns 400 and 401.

Figure 4H:
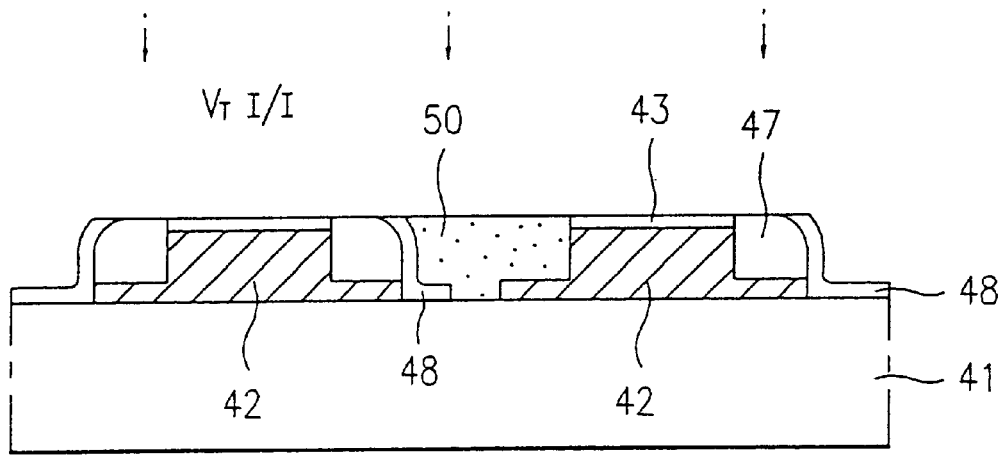

Referring to FIG. 4H, the fourth insulating layer 48, the second insulating layer 44, and the second polysilicon layer 45 are etched until the first insulating layer 43 is exposed. With the first insulating layer 43 and the conductive layer 50 serving as masks, the sidewall spacers 47 is etched to be as high as the first and second patterns 400 and 401.

Figure 4I:
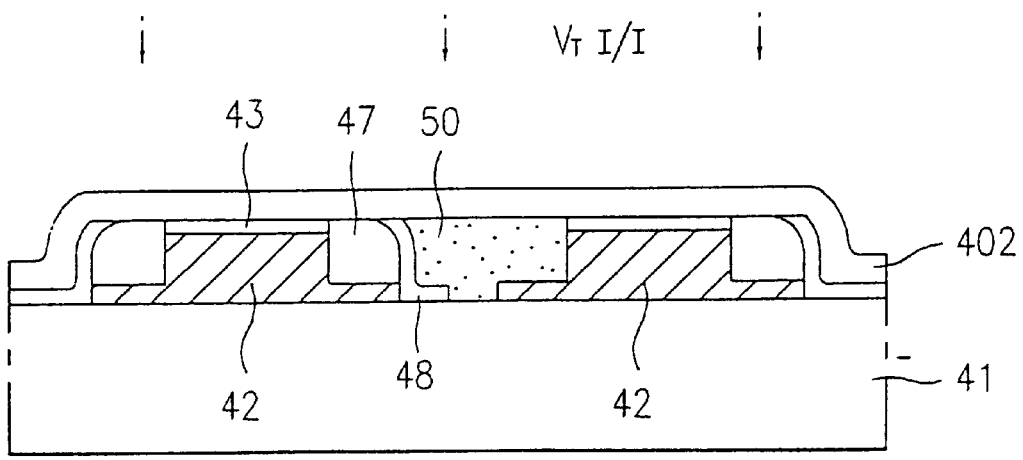

Referring to FIG. 4I, a semiconductor layer 402 used as an active layer is formed on the first insulating layer 43, the sidewall spacers 47, the conductive layer, and the fourth insualting layer 48. This semiconductor layer 402 is made of undoped polysilicon. Thereafter, an ion-injecting process is performed for adjusting threshold voltage of the TFT. In this case, n type impurity ions are injected. Also, a gate insulating film can be formed after removing the first insulating layer 43.

Figure 4J:
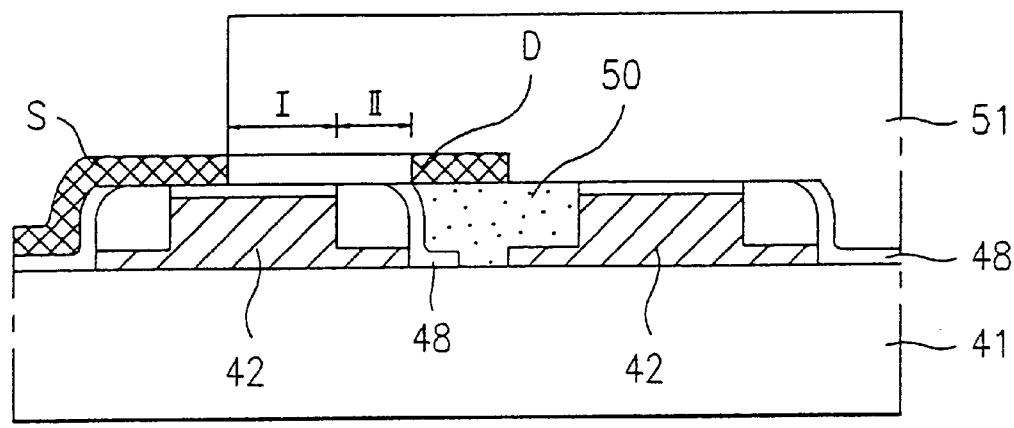

Referring to FIG. 4J, the semiconductor layer 402 around the second pattern 401 is removed. A third photoresist film 51 is coated on the entire surface including the semiconductor layer 402 and patterned to be removed at an outer side of the first pattern 400. P type impurity ions are injected into the semiconductor layer 402 with the third photoresist film 51 serving as a mask. Next, an annealing process is performed so that the injected p type impurity ions are diffused to form a source region S and that p type impurity ions contained in the conductive layer 50 is auto-doped into the semiconductor layer 402 to form a drain region D.

At this time, the semiconductor layer 402, where impurity ions are not diffused over the polysilicon layer 42, is used as a channel region I. The semiconductor layer 402, on the sidewall spacer 47 between the first pattern 400 and the conductive layer 50, is used as an offset region II.

Figure 4K:
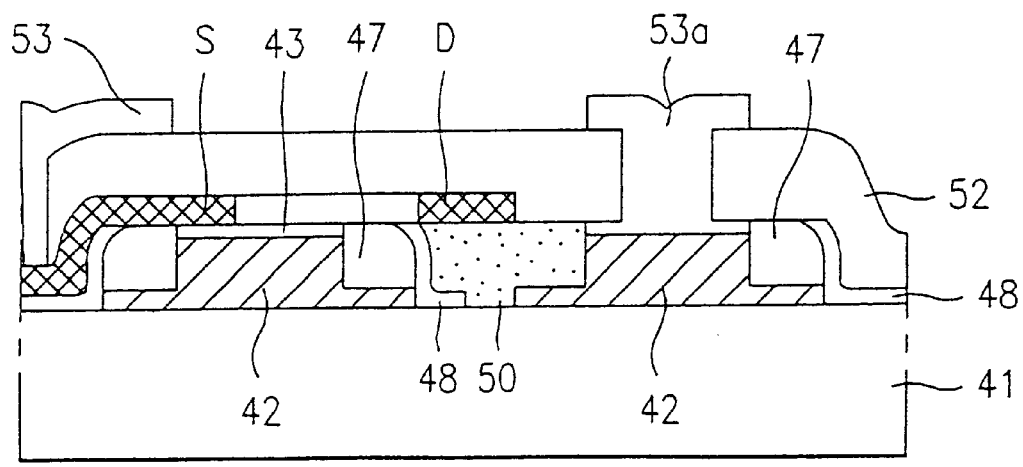

Referring to Fig.4K, the third photoresist film 51 is removed. A fifth insulating layer 52, made of a silicon oxide film, is formed on the entire surface of the substrate including the semiconductor layer 402. The fifth insulating layer 52, on a predetermined area of the source region S, is etched to form a contact hole, and the first insulating layer 43 of the second pattern 401 are etched to form another contact hole. Source and drain electrodes 53 and 53a are formed to connect the source region S and the second pattern 401.

FIGS. 5A to 5J are cross-sectional views showing process steps of a method for manufacturing a TFT according to the second embodiment of the present invention.

Figure 5A:
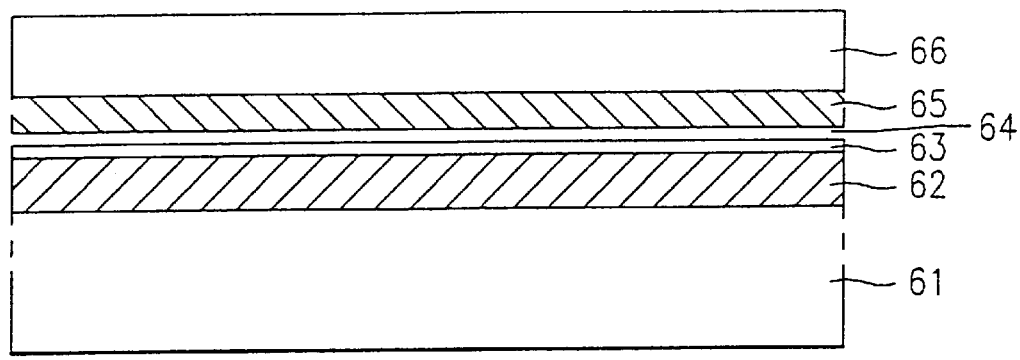
FIGS. 5A to 5J are cross-sectional views showing process steps of a method for manufacturing a TFT according to a second embodiment of the present invention.

Referring to Fig. 5A, a first polysilicon layer 62 is formed on a substrate 61. A first insulating layer 63 and second insulating layer 64 are successively formed on the first polysilicon layer 62. The first insulating layer 63 is used as a gate insulating layer and made of a silicon oxide film and the second insulating layer 64 is made of a silicon nitride film having a high etch ratio with silicon oxide film. Subsequently, a second polysilicon layer 65 having a high etch ratio with the second insulating layer 64 is formed on the second insulating layer 64. A first photoresist film 66 is coated on the entire surface of the second polysilicon layer 65.

Figure 5B:
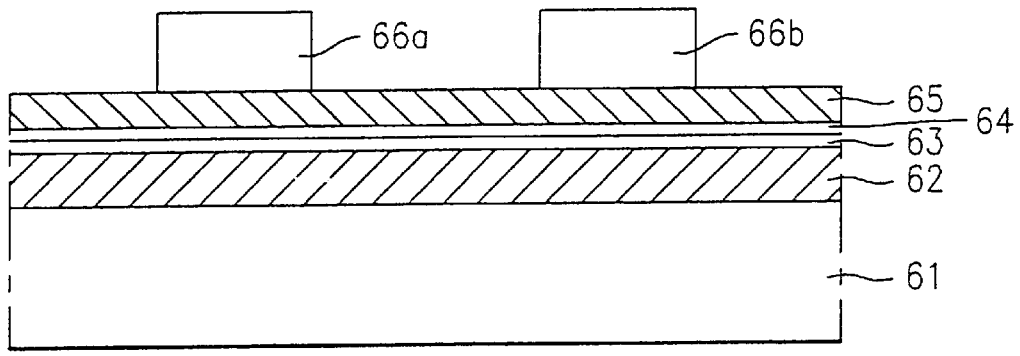

Referring to FIG. 5B, the first photoresist film 66 is patterned with an exposure and development process to form first photoresist patterns 66a and 66b.

Figure 5C:
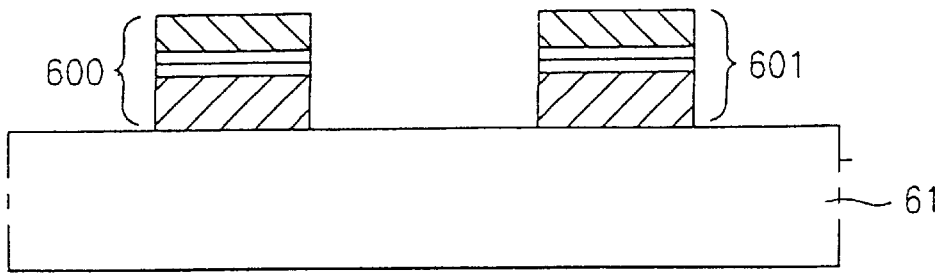

Referring to FIG. 5C, with the first photoresist patterns 66a and 66b serving as masks, the first polysilicon layer 62, the insulating layer 63, the second insulating layer 64, the second polysilicon layer 65 are etched to form first and second patterns 600 and 601. The first photoresist patterns 66a and 66b are removed.

Figure 5D:
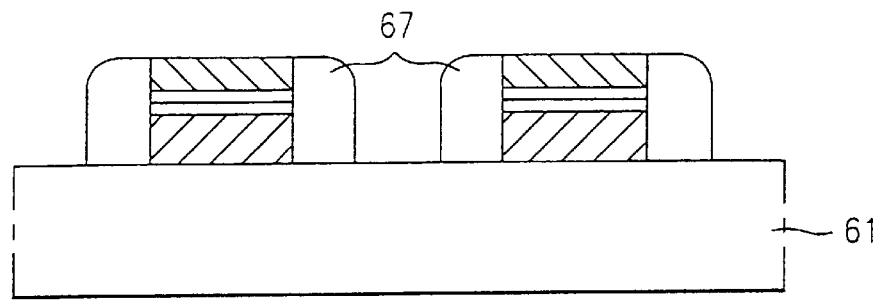

Referring to FIG. 5D, a third insulating layer is formed an o the entire surface of the substrate 61 including the first and second patterns 600 and 601 and etched-back to form sidewall spacers 67 on both sides of the first and second patterns 600 and 601. The third insulating layer is made of a silicon oxide film. The width of the sidewall spacer 67 depends on the thickness of the third insulating layer. That is, the thickness of the third insulating layer is adjusted to provide a desired width of the sidewall spacer 67.

Figure 5E:
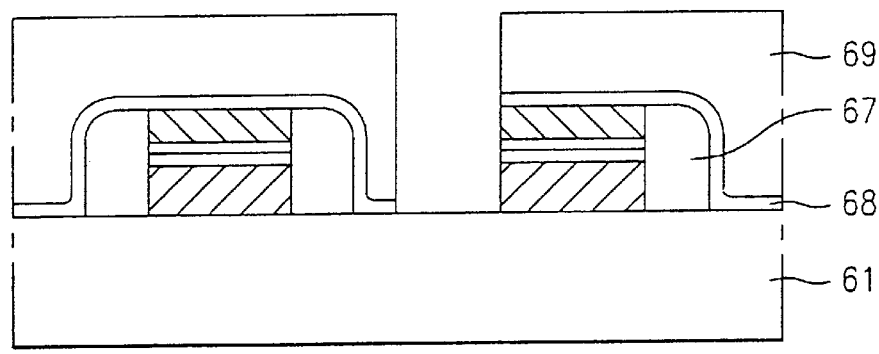

Referring to FIG. 5E, a fourth insulating layer 68, made of silicon oxide film, is formed on the substrate 61 including the sidewall spacers 67 and the first and second patterns 600 and 601. A second photoresist film 69 is coated on the fourth insulating layer 68 and patterned to expose the fourth insulating layer 68 on the sidewall spacer 67 of the second pattern 601 between the first and second patterns 600 and 601 and on the adjoining substrate between the patterns 600 and 601. The sidewall spacer 67 and the fourth insulating layer 68 are removed with the second photoresist film 69 serving as a mask.

Figure 5F:
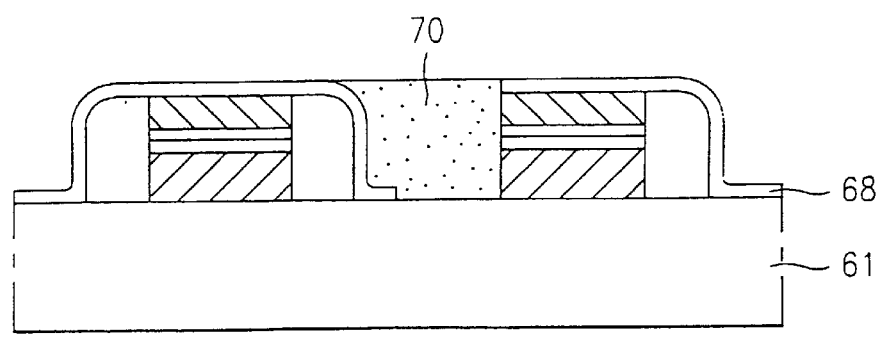

Referring to FIG. 5F, the second photoresist film 69 is removed. A conductive layer 70 is formed on the substrate 61 and etched-back to remain on the substrate 61 and the fourth insulating layer 68 between the first and second patterns 600 and 601. The conductive layer 70 is a p type doped polysilicon.

Figure 5G:
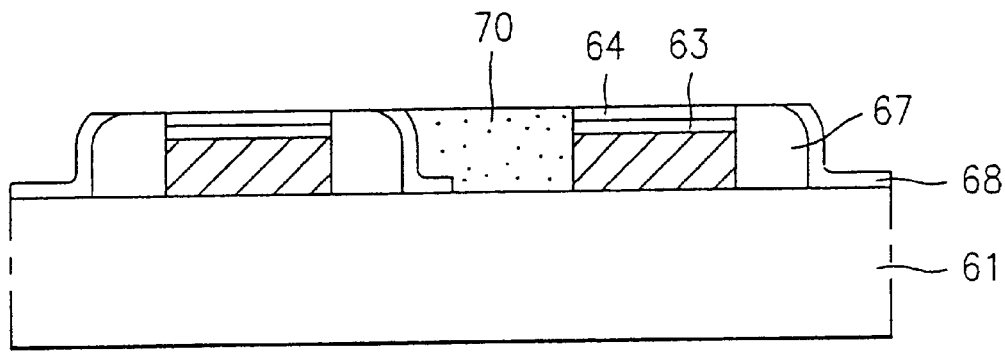

Referring to FIG. 5G, the fourth insulating layer 68, the second polysilicon layer 65, and the conductive layer 70 are etched to expose the second insulating layer 64. The sidewall spacers 67 are etched to be as high as the first and second patterns 600 and 601 with the second polysilicon removed.

Figure 5H:
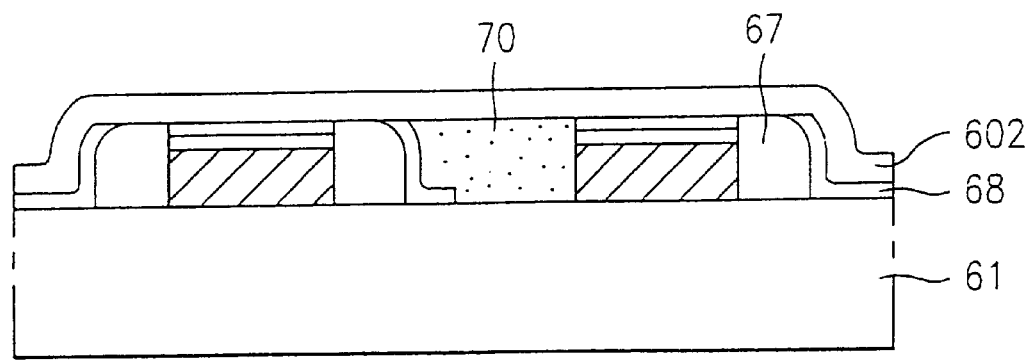

Referring to FIG. 5H, a semiconductor layer 602 used as an active layer is formed on the second insulating layer 64, the sidewall spacers 67, the conductive layer 70, and the fourth insulating layer 68. This semiconductor layer 602 is made of undoped polysilicon. An ion-injecting process is performed over the semiconductor layer 602 for adjusting a threshold voltage of a TFT. In this case, n type impurity ions are used. In this case, a gate insulating layer can be formed after removing the second insulating layer 64.

Figure 5I:
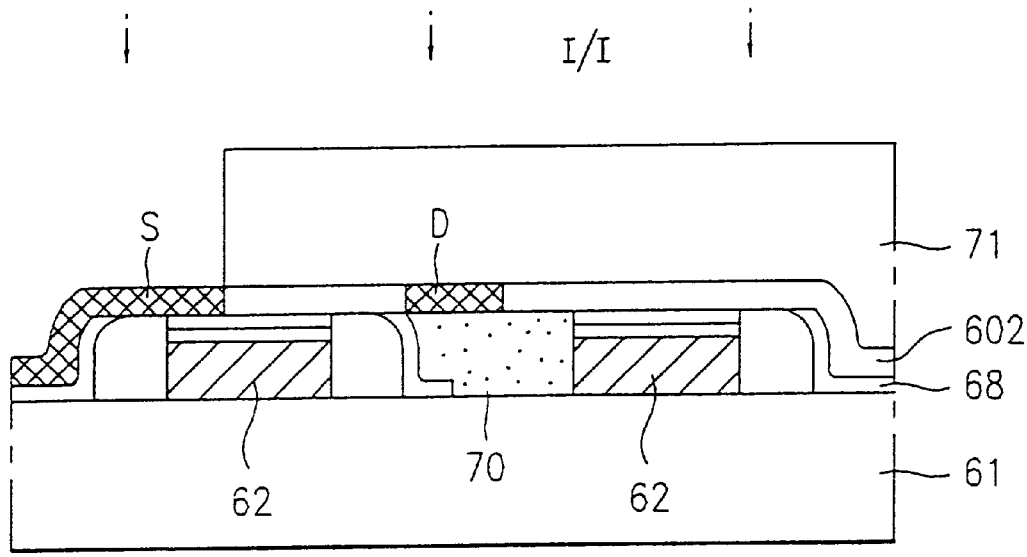

Referring to FIG. 5I, the semiconductor layer 602 around the second pattern 601 is removed. A third photoresist film 71 is coated on the entire surface including the semiconductor layer 602 and patterned to be removed around the sidewall spacer at the outer side of the first pattern 600. With the third photoresist film 71 serving as a mask, p type impurity ions are injected into the semiconductor layer 602. An annealing process is performed so that the injected p type impurity ions are diffused to form a source region S, and that the p type impurity ions contained in the conductive layer 70 are auto-doped to form a drain region D in the semiconductor layer 602 on the conductive layer 70.

At this time, the semiconductor layer 602 where the impurity At ions are not diffused over the first polysilicon layer 62 of the first pattern 600 is a channel region. The semiconductor layer 602 on the sidewall spacer 67 of the first pattern 600 is an offset region II.

Figure 5J:
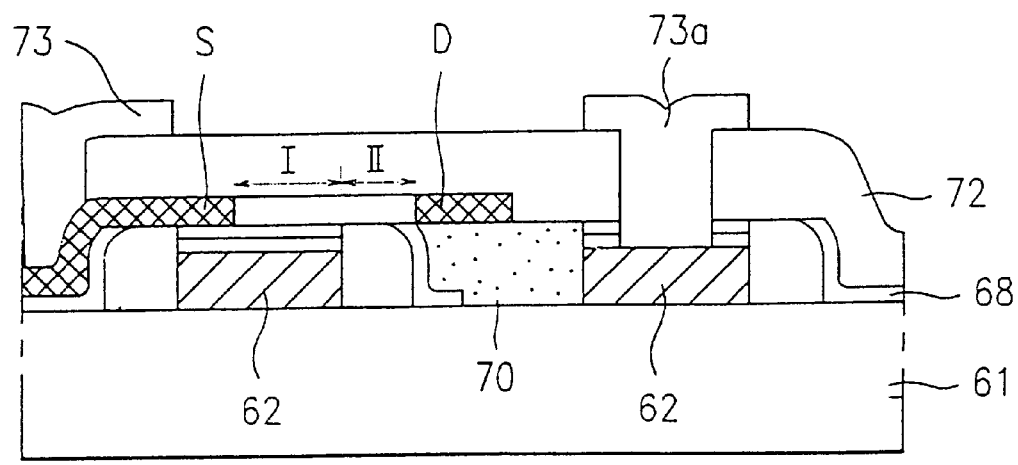

Referring to FIG. 5J, the third photoresist film 71 is removed. A fifth insulating layer 72 is formed on the entire surface including the semiconductor layer 602. The fifth insulating layer 72, the first and second insulating layers 63 and 64 of the second pattern 601 are etched to form a contact hole, and the fifth insulating layer 72 on the source region S is etched to form another contact hole. In this case, the fifth insulating layer 72 is made of a silicon oxide film. Source and drain electrodes 73 and 73a are formed so that the source region S is connected to the second pattern 601.

FIGS. 6A to 6I are cross-sectional views showing process steps of a method for manufacturing a TFT according to the third embodiment of the present invention.

Figure 6A:
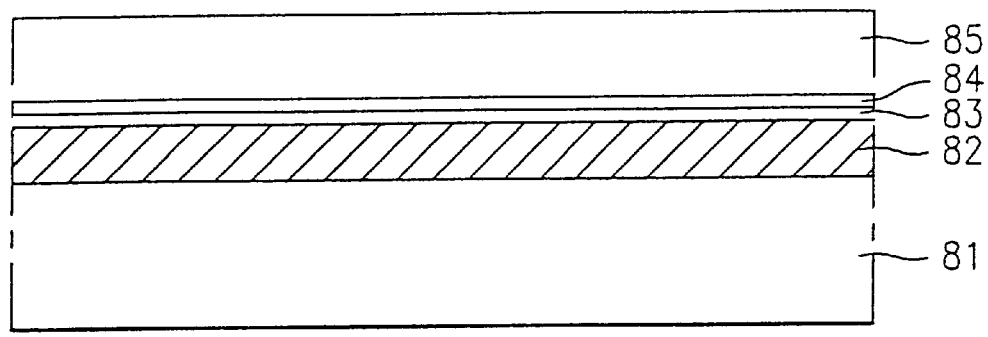
FIGS. 6A to 6I are cross-sectional views showing process steps of a method for manufacturing a TFT according to a third embodiment of the present invention.

Referring to FIG. 6A, a polysilicon layer 82 for a gate electrode of a TFT is formed on a substrate 81. First and second insulating layers 83 and 84 are successively formed to be stacked on the polysilicon layer 82. Subsequently, a first photoresist film 85 is coated on the second insulating layer 84. The first insulating layer 83 functioning as a gate insulating layer is made of silicon oxide and the second insulating layer 84 is made A of silicon nitride having a high etch ratio with silicon oxide.

Figure 6B:
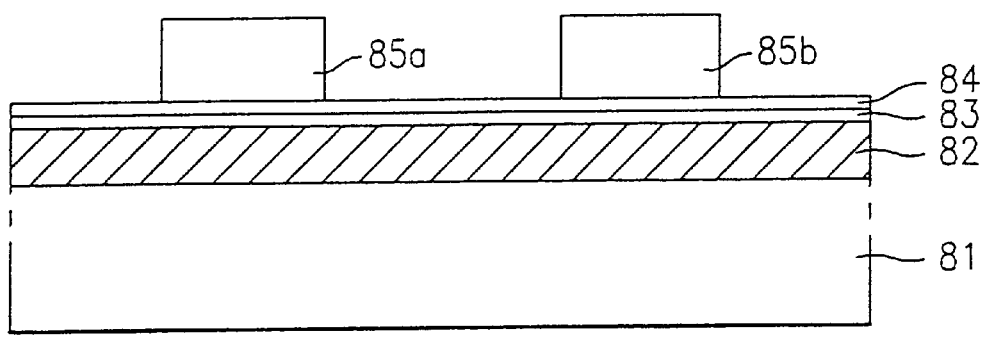

Referring to FIG. 6B, the photoresist film 85 is patterned &lo with an exposure and development process to form first photoresist patterns 85a and 85b.

Figure 6C:
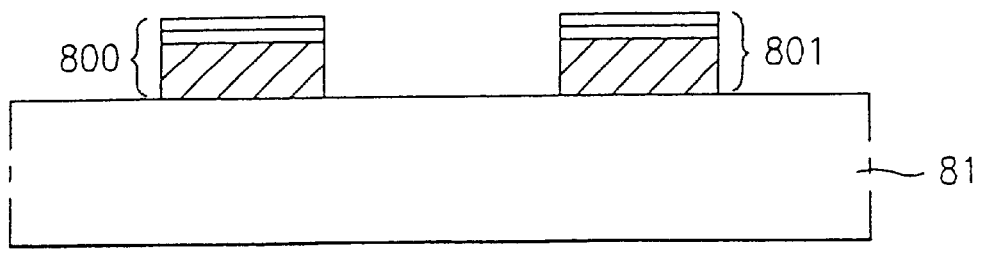

Referring to FIG. 6C, with the first photoresist patterns 85a and 85b serving as masks, the first polysilicon layer 82 and the first and second insulating layers 83 and 84 are successively to form first and second patterns 800 and 801.

Figure 6D:
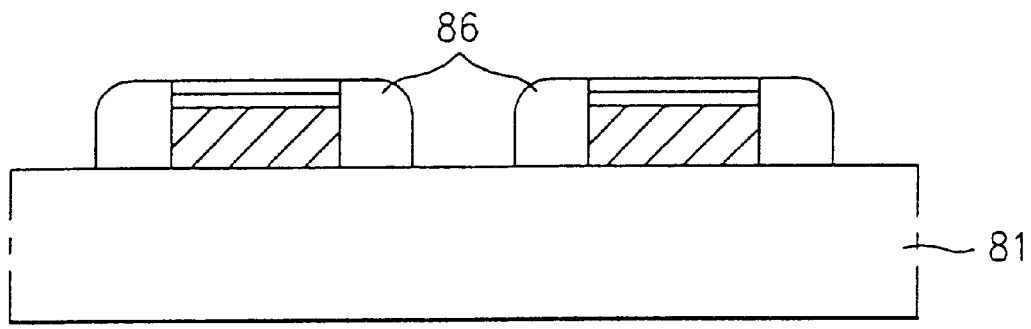

Referring to FIG. 6D, a third insulating layer, made of silicon oxide, is formed on the substrate 81 including the first and second patterns 800 and 801 and etched-back to form sidewall spacers 86 on both sides of the first and second patterns 800 and 801. The width of the sidewall spacers 86 depends of the thickness on the third insulating layer. That is, the thickness of the third insulating layer is adjusted to provide a desired width of the sidewall spacers 86.

Figure 6E:
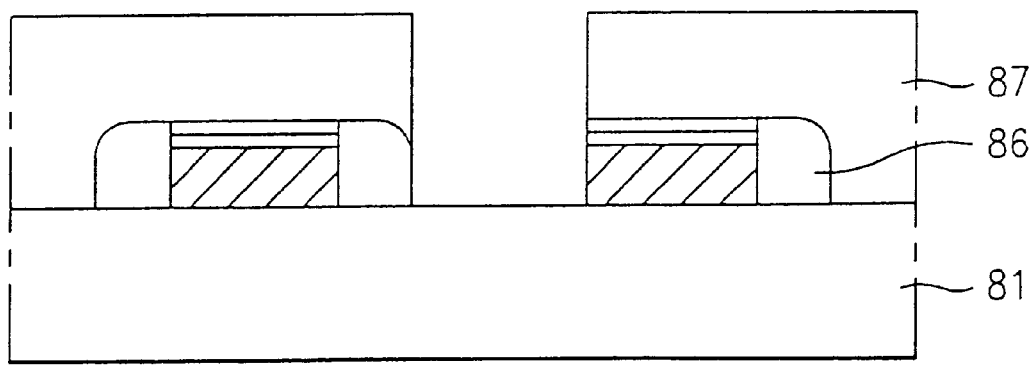

Referring to FIG. 6E, a second photoresist film 87 is coated on the substrate 81 including the first and second patterns 800 and 801 and the sidewall spacers 86, and patterned to expose the sidewall spacer 86 of the second pattern 801 between the first and second patterns 800 and 801 and the adjoining substrate between the first and second patterns 800 and the 801. With the patterned photoresist film 87 serving as a mask, the sidewall spacer of the second pattern 801 between the first and second patterns 800 and 801 is removed.

Figure 6F:
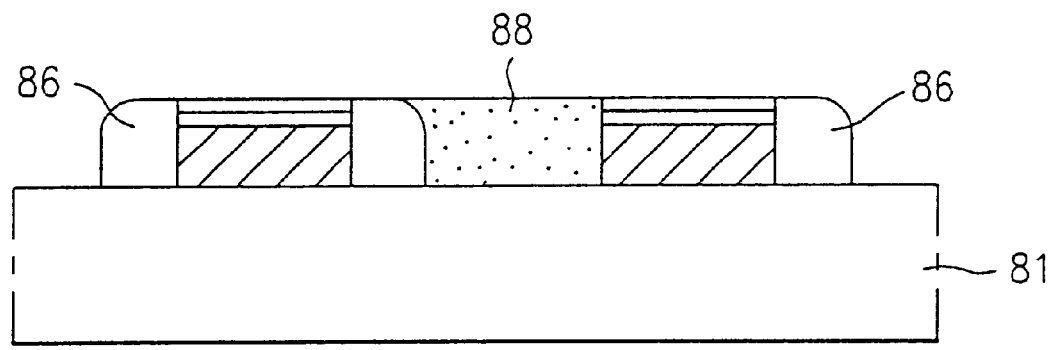

Referring to FIG. 6F, the second photoresist film 87 is removed. A conductive layer 88, made of p type doped polysilicon, is formed on the substrate 81 including the first and second patterns 800 and 801 and the sidewall spacers 86 and etched-back to remain on the substrate 81 between the first and second patterns 800 and 801.

Figure 6G:
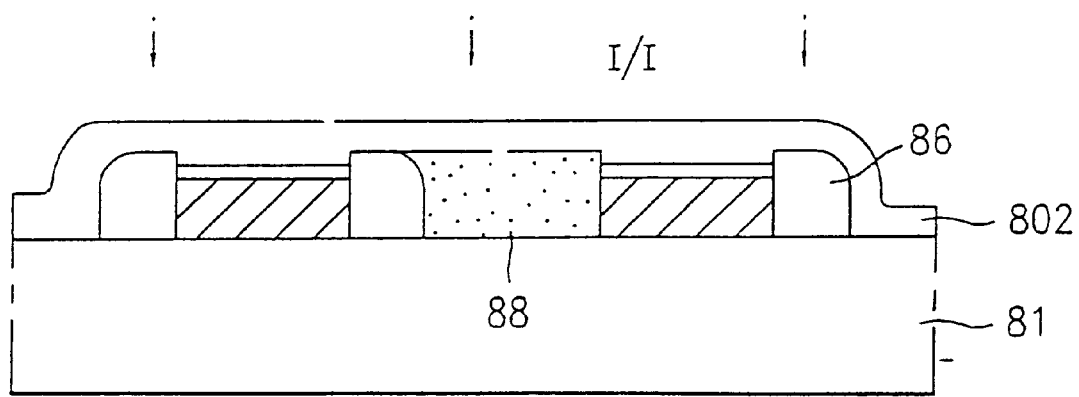

Referring to FIG. 6G, the second insulating layer 84 is removed. A semiconductor used as an active layer is formed on the substrate 81 including the first insulating layer 83, the sidewall spacer 86, the conductive layer 88. This semiconductor layer 802 is made of undoped polysilicon. Thereafter, an ion-injecting process for adjusting threshold voltage of a TFT is performed over the semiconductor layer 802. In this case, n type impurity ions are used. Also, a gate insulating layer can be formed after removal of the first insulating layer 83.

Figure 6H:
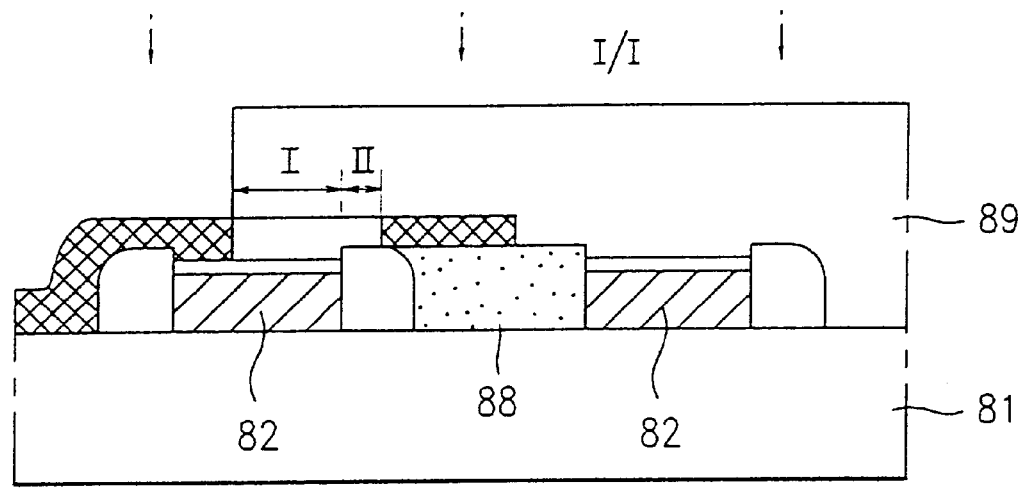

Referring to FIG. 6H, the semiconductor layer 802 on the second pattern 801 and portions adjoining to the second-pattern 801 is removed. Then a third photoresist film 89 is coated on the entire surface including the semiconductor layer 802 and patterned to be removed on the semiconductor layer 802 at the outer side of the first pattern 800. With the patterned third photoresist film 89 serving as a mask, p type impurity ions are injected into the semiconductor layer 802. Next, an annealing process is performed to diffuse the p type impurity ions, thereby forming a source region S. The p type impurity ions in the conductive layer 88 are auto-doped to simultaneously form a drain region D.

It is possible to use the first polysilicon layer 82 of the first pattern 800 as a gate electrode. The semiconductor layer 802 where impurity ions are not diffused on the first polysilicon layer 82 is a channel region I.

Figure 6I:
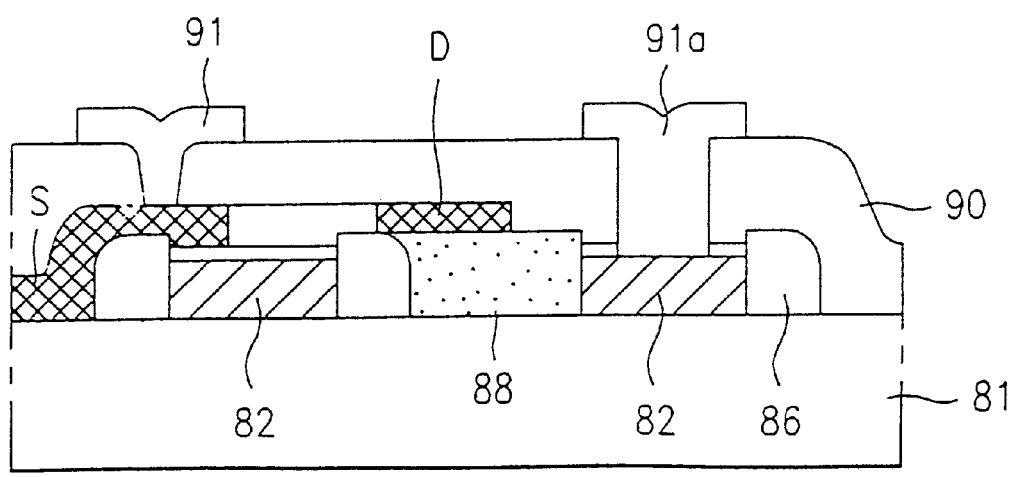

Referring to FIG. 6I, a fourth insulating layer 90 is formed on the entire surface of the structure including semiconductor layer 802. The fourth insulating layer 90 over the source region S is etched to form a contact hole, and the fourth and first insulating layer 83 and 90 on the second polysilicon layer 82 of the second pattern 801 are etched to form another contact hole. Source and drain electrodes 91 and 91a are formed so that the source region S is electrically connected to the polysilicon layer 82 of the second pattern 801.

The TFT and the method for manufacturing the same have the following advantages. Since an offset region is formed in a self-align method, the change of current-voltage characteristic of a TFT is minimized. Further, since a gate electrode of an inverse-T type is formed to increase on-current, device reliability is enhanced.

It will be apparent to those skilled in the art that various modification and variations can be made in the TFT and the method for manufacturing the same of the present invention without departing from the spirit or scope of the inventions. Thus, it is intended that the present invention cover the modifications and variations of this invention provided they come within the scope of the appended claims and their equivalents.

What is claimed is:

1. A method to manufacture a TFT device, the method comprising:

forming first and second patterns on a substrate;

forming a first sidewall spacer on a first side of said first pattern in between said first and second patterns;

forming a conductive layer pattern on said substrate in between said first sidewall spacer and said second pattern;

forming an active layer on said first pattern, said first sidewall spacer, and said conductive layer pattern; and forming a source region in said active layer at a second side of said first pattern; and forming a drain region in said active layer above said conductive layer pattern.

2. The method of claim 1, wherein the step of forming said first and second patterns comprises:

sequentially forming a first conductor and a first and second insulators on said substrate;

forming a first mask above said second insulator defining first and second pattern areas; and etching said first conductor and said first and second insulators to form said first and second patterns below said first and second pattern areas using said mask.

3. The method of claim 2, wherein said first conductor is made of polysilicon, said first insulator is made of silicon oxide, and said second insulator is made of silicon nitride.

4. The method of claim 2; further comprising:

forming a second conductor on said second insulator prior to forming said first mask; and etching said first conductor, said first and second insulators, and said second conductor when forming said first and second patterns.

5. The method of claim 4, wherein said second conductor is made of polysilicon.

6. The method of claim 2, further comprising:

forming a pattern insulator on said second insulator prior to forming said first mask; and etching said pattern insulator, said first and second insulators, and said second conductor when forming said first and second patterns.

7. The method of claim 6, wherein said pattern insulator is made of silicon oxide.

8. The method of claim 2, wherein said first conductor is etched such that said first and second pattern have predetermined thickness extensions.

9. The method of claim 1, wherein the step of forming said first sidewall spacer and the step of forming said conductive layer pattern comprise:

forming a third insulator on said substrate including on said first and second patterns;

patterning said third insulator to form sidewall spacers on both sides of said first and second patterns including said first sidewall spacer;

forming a fourth insulator on said substrate over first and second patterns and said sidewall spacers;

etching said sidewall spacer of said second pattern facing said first pattern;

forming said conductive layer pattern on said substrate between said first sidewall spacer and said second pattern; and planarizing said conductive layer pattern, said sidewall spacers, said fourth insulator, and said first and second patterns to a predetermined height.

10. The method of claim 9, wherein prior to the planarizing step occurs, said first and second patterns include in sequence a first conductor, a first insulator, and a second insulator before said planarizing step takes place.

11. The method of claim 10, wherein said predetermined height is a height of said first insulator.

12. The method of claim 11, wherein prior to the planarizing step occurs, said first and second patterns further include a second conductor above said second insulator.

13. The method of claim 10, wherein said predetermined height is a height of said second insulator.

14. The method of claim 9, wherein said conductive layer pattern is made of doped polysilicon.

15. The method of claim 1, wherein the step of forming said active layer comprises:

forming an undoped semiconductor layer on said first and second patterns, said first sidewall spacer, and said conductive layer pattern;

injecting ions into said semiconductor layer; and removing a portion of said semiconductor layer above said second pattern so that the remaining portion of said semiconductor defines said active layer.

16. The method of claim 1, wherein the step of forming said source region comprises:

injecting ions into said active layer at said second side of said first pattern; and annealing to diffuse said injected ions.

17. The method of claim 1, wherein the step of forming said drain region comprises annealing to diffuse ions from said conductive layer pattern into said drain region.

18. The method of claim 1, further comprising:

forming a protective insulator over said substrate including said active layer, said conductive layer pattern, and said second pattern leaving a first contact hole exposing at least a portion of said source region and leaving a second contact hole exposing at least a portion of said drain region;

forming a drain electrode contacting said source region through said first contact hole;

forming a drain electrode contacting said drain region through said second contact hole.

19. A method for manufacturing a TFT, comprising:

successively forming a first conductive layer, a first insulating layer, and a second conductive layer on a substrate;

patterning the first conductive layer, the first insulating layer, and the second conductive layer to form first and second patterns, the first pattern having first and second sides;

forming a sidewall spacer on the first side of the first pattern facing the second pattern;

forming a conductive layer pattern between the sidewall spacer and the second pattern;

forming an active layer on the first insulating layer on the first pattern, the sidewall spacer, the conductive layer pattern, and the substrate; and forming source and drain regions in the active layer at the second side of the first pattern and in the active layer above the conductive layer pattern, respectively.

20. The method as claimed in claim 19, wherein the conductive layer pattern contains impurity ions.

21. The method as claim in claim 19, wherein the step of forming the source and drain regions comprises:

forming a photoresist film on the active layer;

removing the photoresist film on the active layer at the second side of the first pattern to form a photoresist pattern;

injecting impurity ions into the active layer with the photoresist pattern serving as a mask;

removing the photoresist pattern; and subjecting an annealing process so that the injected impurity ions are diffused to form a source region and impurity ions of from the conductive layer pattern are diffused into the active layer above the conductive layer pattern to form a drain region.

22. The method as claimed in claim 19, wherein the step of forming the sidewall spacer comprises:

forming a second insulating layer on the substrate including the first and second patterns;

etching the second insulating layer to form sidewall spacers on sides of the first and second patterns;

coating a photoresist film on the substrate including the first and second patterns and the sidewall spacers;

patterning the photoresist film to expose the sidewall spacer of the second pattern facing the first pattern; and removing the exposed sidewall spacer with of the second pattern.

23. The method as claimed in claim 19, further comprising:

forming a fifth insulating layer on the active layer;

removing the first and second insulating layers over the source and drain regions to form contact holes; and forming source and drain electrodes on the contact holes and the second insulating layer.

24. A method for manufacturing a TFT, comprising:

successively forming a first conductive layer, first and second insulating layers, and a predetermined layer on a substrate;

patterning the first conductive layer, the first and second insulating layers, and the predetermined layer to form first and second patterns having first and second sides;

forming a sidewall spacer on the first side of the first pattern facing the second pattern;

forming a conductive layer pattern between the sidewall spacer and the second pattern;

etching the predetermined layer, the conductive layer pattern, and the sidewall spacer to be as high as the second insulating layer;

etching the second insulating layer;

forming an active layer on the sidewall spacer, the conductive layer pattern, the first insulating layer of the first pattern, and the substrate; and forming source and drain regions in the active layer at the second side of the first pattern and in the active layer above the conductive layer pattern, respectively.

25. The method as claimed in claim 24, wherein the step of forming the sidewall spacer comprises:
   forming a third insulating layer on the substrate including the first and second patterns:
   etching the third insulating layer to form sidewall spacers on sides of the first and second patterns;
   forming a fourth insulating layer on the substrate including the first and second patterns and the sidewall spacers;
   forming a photoresist film on the fourth insulating layer;
   patterning the photoresist film to expose a portion of the fourth insulating layer above the sidewall spacer on a side of the second pattern facing the first pattern to form a photoresist pattern; and
   removing the exposed portion of the fourth insulating layer and the sidewall spacer beneath the exposed portion of the fourth insulating layer with the photoresist pattern serving as a mask.

26. The method as claimed in claim 25, wherein the step of forming the conductive layer pattern comprises:
   forming a conductive material on the substrate between the first and second patterns; and
   etching-back the conductive material until a remaining portion of the fourth insulating layer is exposed to form the conductive layer pattern.

27. The method as claimed in claim 24, wherein the conductive layer pattern is a p type doped polysilicon layer.

28. The method as claimed in claim 24, wherein an offset region is formed in the active layer above the sidewall spacer on the first side of the first pattern, and a channel region is formed in the active layer above the first pattern.

29. The method as claimed in claim 24, wherein the first conductive layer and the predetermined layer are made of polysilicon.

30. The method as claimed in claim 24, wherein the predetermined layer is made of a silicon oxide film.

31. The method as claimed in claim 24, wherein the step of etching the predetermined layer, the conductive layer pattern, and the sidewall spacer to be as high as the second insulating layer comprises:
   etching the predetermined layer and the conductive layer pattern until the second insulating layer is exposed; and
   etching the sidewall spacer with the second insulating layer and the conductive layer serving as masks.

32. The method as claimed in claim 24, wherein the first and second insulating layers are a silicon oxide film and a silicon nitride film, respectively.

33. The method as claimed in claim 24, wherein the step of forming the first and second patterns comprises:
   forming a photoresist pattern on the predetermined layer;
   etching the first and second insulating layers, the predetermined layer, and the first conductive layer with the photoresist pattern serving as a mask so that the first conductive layer remains on the substrate to form extensions of the first and second patterns of a predetermined thickness.

34. The method as claimed in claim 33, wherein the step of forming the sidewall spacers comprises:
   forming a third insulating layer on the substrate including the first and second patterns;
   etching the third insulating layer to form the sidewall spacers on sides of the first and second patterns such that portions of the extensions are exposed; and
   etching the exposed extensions with the sidewall spacers serving as masks.

35. The method as claimed in claim 33 further comprising:
   forming a fourth insulating layer on the substrate including the first and second patterns, the conductive layer pattern, and the sidewall spacers;
   forming a photoresist film on the fourth insulating layer;
   patterning the photoresist film to expose a portion of the fourth insulating layer above the sidewall spacer of one side of the second pattern facing the first pattern to form photoresist pattern; and
   removing the exposed portion of the fourth insulating layer and the sidewall spacer beneath the exposed portion of the fourth insulating layer with the photoresist pattern serving as a mask.

* * * * *